(12) United States Patent
Ingalls et al.

(10) Patent No.: US 6,345,013 B1
(45) Date of Patent: Feb. 5, 2002

(54) LATCHED ROW OR COLUMN SELECT ENABLE DRIVER

(75) Inventors: Charles L. Ingalls, Meridian; Huy T. Vo, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/898,084

(22) Filed: Jul. 5, 2001

(51) Int. Cl.$^7$ ................................................. G11C 8/00
(52) U.S. Cl. ........................... 365/230.08; 365/189.07; 365/230.06
(58) Field of Search ....................... 365/230.06, 230.08, 365/189.07, 189.05, 200

(56) References Cited

U.S. PATENT DOCUMENTS

| | | | | |
|---|---|---|---|---|
| 5,016,226 A | * | 5/1991 | Hiwada et al. | 365/233 |
| 5,235,545 A | * | 8/1993 | McLaury | 365/189.04 |
| 5,410,582 A | * | 4/1995 | Sato | 327/51 |
| 5,548,787 A | * | 8/1996 | Okamura | 395/845 |
| 5,966,333 A | * | 10/1999 | Otani et al. | 365/200 |
| 6,144,592 A | * | 11/2000 | Kanda | 365/200 |
| 6,178,532 B1 | | 1/2001 | Pierce et al. | |
| 6,187,532 B1 | * | 1/2001 | Pierce et al. | 365/200 |

* cited by examiner

*Primary Examiner*—Son T. Dinh
(74) *Attorney, Agent, or Firm*—Dickstein Shapiro Morin & Oshinsky LLP

(57) ABSTRACT

A column latch device uses first and second latches, the first controlling input to the second, to enable a column line in a redundant column line control system for a memory device. A column select signal is selectively passed to the second latch when the first latch receives a predetermined signal from an address comparator which checks an incoming column address against stored defective addresses.

2 Claims, 4 Drawing Sheets

LATCHED ROW OR COLUMN SELECT ENABLE DRIVER

BACKGROUND OF THE INVENTION

I. Field of the Invention

The present invention relates generally to a device and method for semiconductor memory devices employing redundant elements. In particular, the present invention relates to minimizing circuitry for enabling or disabling a column select signal for a primary column in a memory array.

II. Description of the Related Art

In order to ensure proper operation, semiconductor devices are typically tested before being packaged into a chip. A series of probes on a test station electrically contact pads on each die to access portions of the individual semiconductor devices on the die. For example, in a semiconductor memory device, the probes contact address pads and data input/output pads to access selected memory cells in the memory device. Typical dynamic random access memory ("DRAM") devices include one or more arrays of memory cells arranged in columns and rows. Each array of memory cells includes word or row lines that select memory cells along a selected row, and bit or column lines (or pairs of lines) that select individual memory cells along a column to read data from, or write data to, the cells in the selected column.

During a primary pretest, predetermined data or voltage values are typically written to selected column and row addresses that correspond to certain memory cells, and then the voltage values are read from those memory cells to determine if the read data matches the data written to those addresses. If the read data does not match the written data, then the memory cells at the selected addresses likely contain defects and the semiconductor device fails the test.

Many semiconductor devices, particularly memory devices, include redundant circuitry on the semiconductor device that can be employed to compensate for certain detected failures. As a result, by enabling such redundant circuitry, the device need not be discarded even if it fails a particular pretest. For example, memory devices typically employ redundant columns and rows of memory cells so that if a memory cell in a column or row of the primary memory array is defective, then an entire column or row, or segments thereof, of redundant memory cells can be substituted therefor, respectively.

Substitution of one of the redundant columns or rows or segments thereof is conventionally accomplished by programming fuses or antifuses in a bank of latch devices to select redundant columns or rows or segments to replace defective primary columns or rows. Each bank represents a memory address. If a given primary column or row in the array contains a defective memory cell, then the die can be moved to a station where programming of the fuses or antifuses is accomplished to produce a binary output matching the defective address. For example, if the defective primary column or row has an 8-bit binary address of 00100100, appropriate fuses or antifuses in a bank of 8 are programmed to store this address.

Conventionally, as shown in FIG. 1 which shows a redundant select circuit for a column, when an address in the memory device is accessed, a column address compare circuit 100 compares an incoming address to addresses stored in the fuse or antifuse banks to determine whether the incoming address matches an address containing a defective memory cell. If the column address compare circuit 100 determines such a match, then it outputs a match signal 150 to a controller in a column decoder 200. In response, the column decoder 200 causes an appropriate redundant column to be accessed, and disables the column select signal 250, thus disabling the column drive signal 350 for the defective primary column in the memory array 400 each time a match is found with a redundant column. (Each primary column 400 has a dedicated column latch 300.) The column decoder 200 goes through this procedure each and every time the memory device receives an incoming address pertaining to its primary column 400. If the column address compare circuit 100 does not find a match with a redundant column, the column decoder 200 enables the column select signal 250 to provide the column latch 300 with a column select signal 250 to enable a column drive signal 350 to access the primary column 400. By disabling or enabling a column select signal 250 each time an incoming address is received, the above device and method are inefficient. The device and method are also inefficient in terms of timing, since the column decoder 200 must wait for the output from the column address compare circuit 100 in order to proceed.

SUMMARY OF THE INVENTION

The present invention relates to a device and method for use in memory devices employing redundant rows and columns. The present invention provides a row or column latch device which includes an additional latch to latch the output of a row or column address compare circuit, such that a row or column select signal need not be disabled or enabled, to determine if a redundant row or column has been programmed for the incoming address, each time an incoming address is received. This reduces the circuitry in the row or column decoder because the circuitry to disable or enable the select signal is no longer needed. In addition, the device and method of the present invention do not require the row or column decoder to wait for the results of the row or column address compare circuit, thus increasing the speed of the memory device.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

The invention herein is applicable to both row and column redundancy selection. However, for purposes of simplifying description of the invention, the invention will be described with particular reference to column redundancy selection. It should be understood that the principles discussed herein are also applicable to row redundancy selection.

Figure 1:
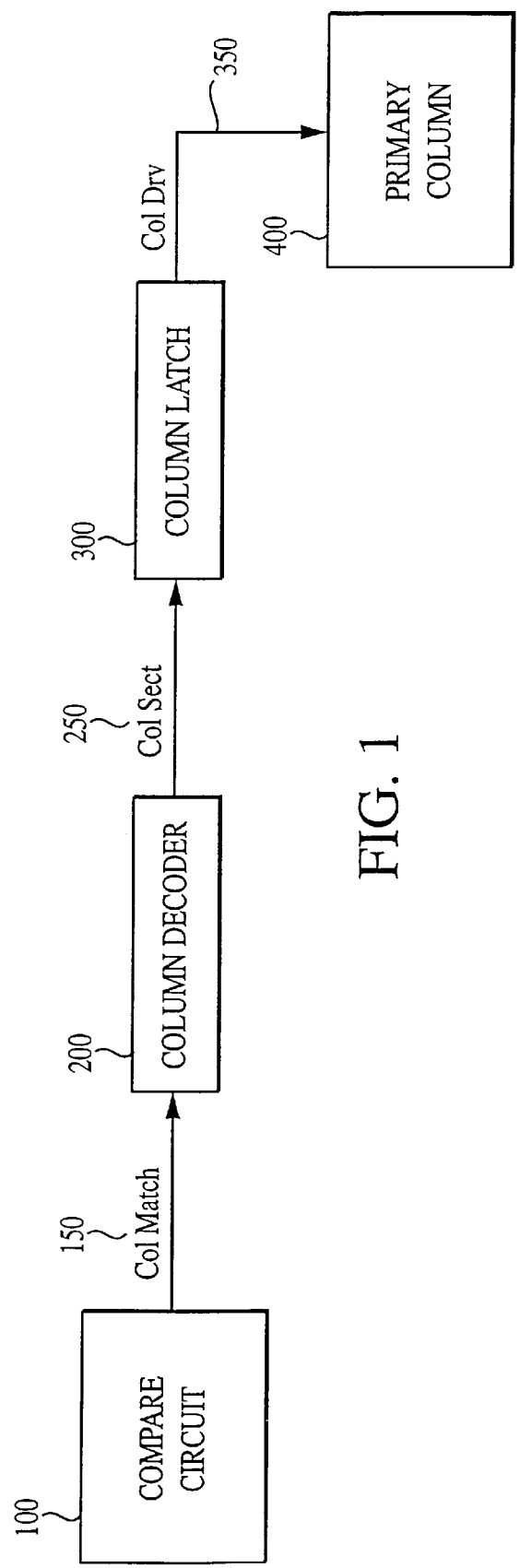
FIG. 1 is an illustration of a portion of a conventional memory device.
Figure 2:
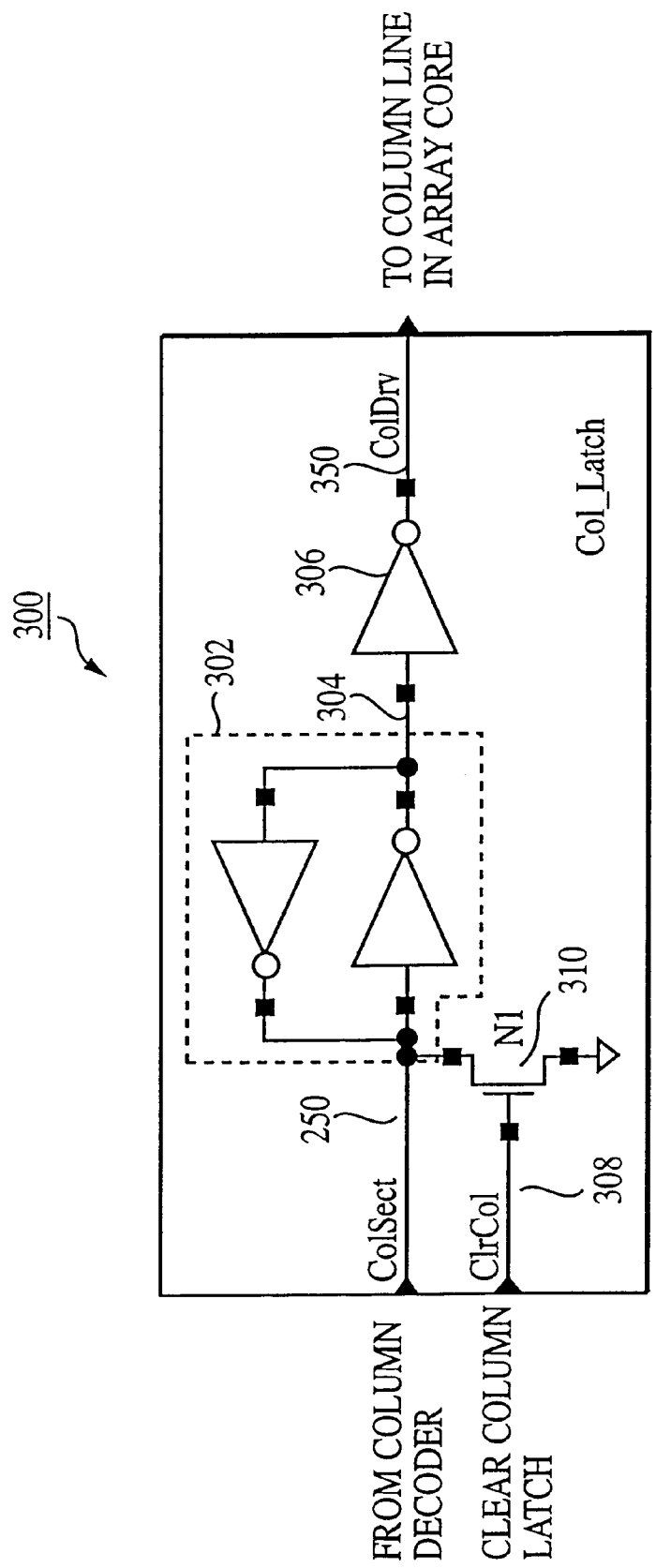
FIG. 2 is an illustration of a conventional column latch device.

Understanding a conventional column latch device used in memory devices, depicted in FIG. 2, is necessary to fully comprehend the present invention, as the present invention improves upon the circuit of FIG. 2. FIG. 2 illustrates a conventional column latch device 300. The column latch device 300 is used in memory devices to enable or disable a primary column 400. Each primary column 400 has one column latch device 300 dedicated to enabling or disabling it. Conventionally, if a primary column 400 is defective, the column decoder 200, based upon the column match 150 signal from the column address compare circuit 100 indicating a matching address, sends a low column select signal 250 to the column latch device 300. The column latch device 300 receives the low column select signal 250 and latches the inverse state of the low column select signal 250, i.e. a high signal, by means of a back to back inverter latch 302. The back to back inverter latch 302 outputs a high signal 304 which is then inverted by inverter 306 to provide a low signal at the output, column drive signal 350. When the column drive signal 350 is low the primary column 400 is disabled and may not be accessed by read or write procedures. A defective primary column must be disabled to present erroneous data from being read out of the defective column.

Conventionally, if a primary column 400 is not defective, the column decoder 200, based upon the column match 150 signal from the column address compare circuit 100 indicating that the incoming addresses does not match a defective address in the primary array 400, sends a high column select signal 250 to the column latch device 300. The column latch device 300 receives the high column select signal 250 and latches the inverse state of the column select signal 250, i.e. a low signal, by means of the back to back inverter latch 302. The back to back inverter latch 302 outputs a low signal 304 which is then inverted by inverter 306 to provide a high signal at the output, column drive signal 350. When the column drive signal 350 is high the primary column 400 is enabled and may be accessed by read or write procedures. After the primary column 400 is accessed and before the next incoming address is received, the column decoder 200 renders a clear column select signal 308 high to drive the gate of transistor 310 to reset the output, column drive signal 350, of the column latch device 300 to low. The above procedure is repeated for each incoming column address and requires the column decoder 200 to contain circuitry to enable or disable the column select signal 250 each time an incoming address is received.

The present invention provides a modification to the column latch device 300 of FIG. 2 to eliminate the need for the circuitry in the column decoder 200 to enabled or disable of the column select signal 250 for each incoming address. The present invention also increases the speed of the memory device by not requiring the column select signal 250 to wait for the column match signal 150.

Figure 3:
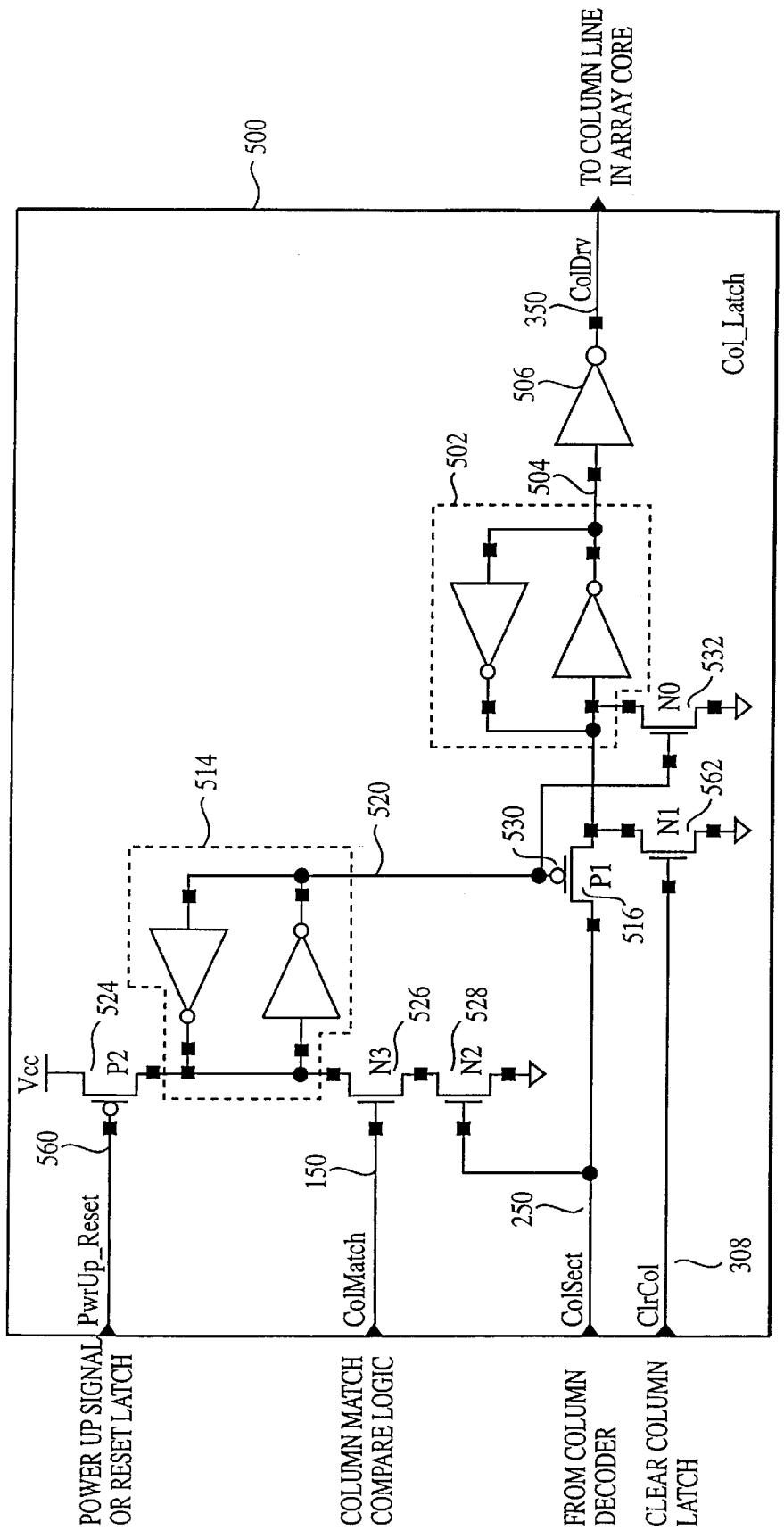
FIG. 3 is an illustration of an improved column latch device in accordance with an exemplary embodiment of the present invention.

FIG. 3 illustrates the modified column latch device 500 of the present invention. Column latch device 500 contains an additional back to back inverter latch 514. The output 520 of back to back latch 514 is coupled to the gate of a p-type transistor 516 which selectively drives the column select signal 250 to back to back inverter latch 502, similar to back to back inverter latch 302.

In operation, the column latch device 500 is reset on power up. During reset a low signal on line 560 is passed to the gate of p-type transistor 524 rendering p-type transistor 524 conductive. In its conductive state p-type transistor 524 passes Vcc (a high signal) to back to back inverter latch 514. Back to back inverter latch 514 latches the inverse state and outputs a low signal on output 520. The reset signal on line 560 is then rendered high placing p-type transistor 524 in a non-conductive state and isolating Vcc. Simultaneous with the resetting of back to back inverter latch 514, back to back inverter latch 502 is also reset. On power up the clear column signal on line 308 is rendered high, placing transistor 562 in a conductive state. In a conductive state transistor 562 passes a low signal (ground) to back to back inverter latch 502 which latches the inverse state and outputs a high signal on output 504. The high signal on output 504 is received by inverter 506 which outputs a low column driver signal 350, disabling the primary array 400. The clear column signal is then rendered low.

Upon receiving an incoming address, whether or not the primary column is defective, the column select signal 250 is rendered high by the column decoder 200, where it can so remain. The high column select signal 250 will render transistor 528 conductive. In accordance with the present invention, the column match signal 150 is received by the column latch device 500 directly from the column address compare circuit 100. If the primary column is defective, the column match signal 150 will be high indicating a match in the redundant column programmed logic. When the column match signal 150 is high it places transistor 526 in a conductive state to conduct a low signal, via transistor 528, to the back to back inverter latch 514. The low signal is provided by transistor 528 connected to ground, which was rendered conductive by the high column select signal 250 applied to its gate. Back to back inverter latch 514 latches the inverse state and outputs a high signal on output 520. The high signal on output 520 is applied to the gate of p-type transistor 516, placing p-type transistor 516 in a non-conductive state. In a non-conductive state p-type transistor 516 prevents the high column select signal 250 from reaching back to back inverter latch 502. In addition, the high signal on output 520 is provided to the gate of transistor 532 placing transistor 532 in a conductive state. In a conductive state transistor 532 will pass a low signal (ground) to back to back inverter latch 502. Back to back inverter latch 502 will latch the inverse state and output a high signal on output 504 to inverter 506. Inverter 506 will output a low signal for the column driver signal 350 thereby disabling the primary array 400.

If the primary device is not defective, the column match signal 150 will be low indicating no match in the redundant column programmed logic. When the column match signal 150 is low, transistor 526 will not be in a conductive state. Thus, the initial state of the back to back inverter latch 514 is maintained and a low signal on output 520 is received by p-type transistor 516 placing p-type transistor 516 in a conductive state. The high column select signal 250 is passed by conductive p-type transistor 526 to back to back inverter latch 502 which latches the inverse state and outputs a low signal 504. The low signal on line 504 is inverted by inverter 506 which passes a high signal for the column drive signal 350 at its output. Thus, the primary column can be accessed.

The above device and method eliminate the need for the column select enable/disable circuitry in the column decoder. The above device and method also provide a faster more efficient memory device because the column select signal 250 and the column match signal 150 may be sent to column latch device 500 at the same time without delaying the column select signal 250.

As noted earlier, although the invention has been described with particular reference to selection of redundant columns, it is also applicable to selection of redundant rows.

Figure 4:
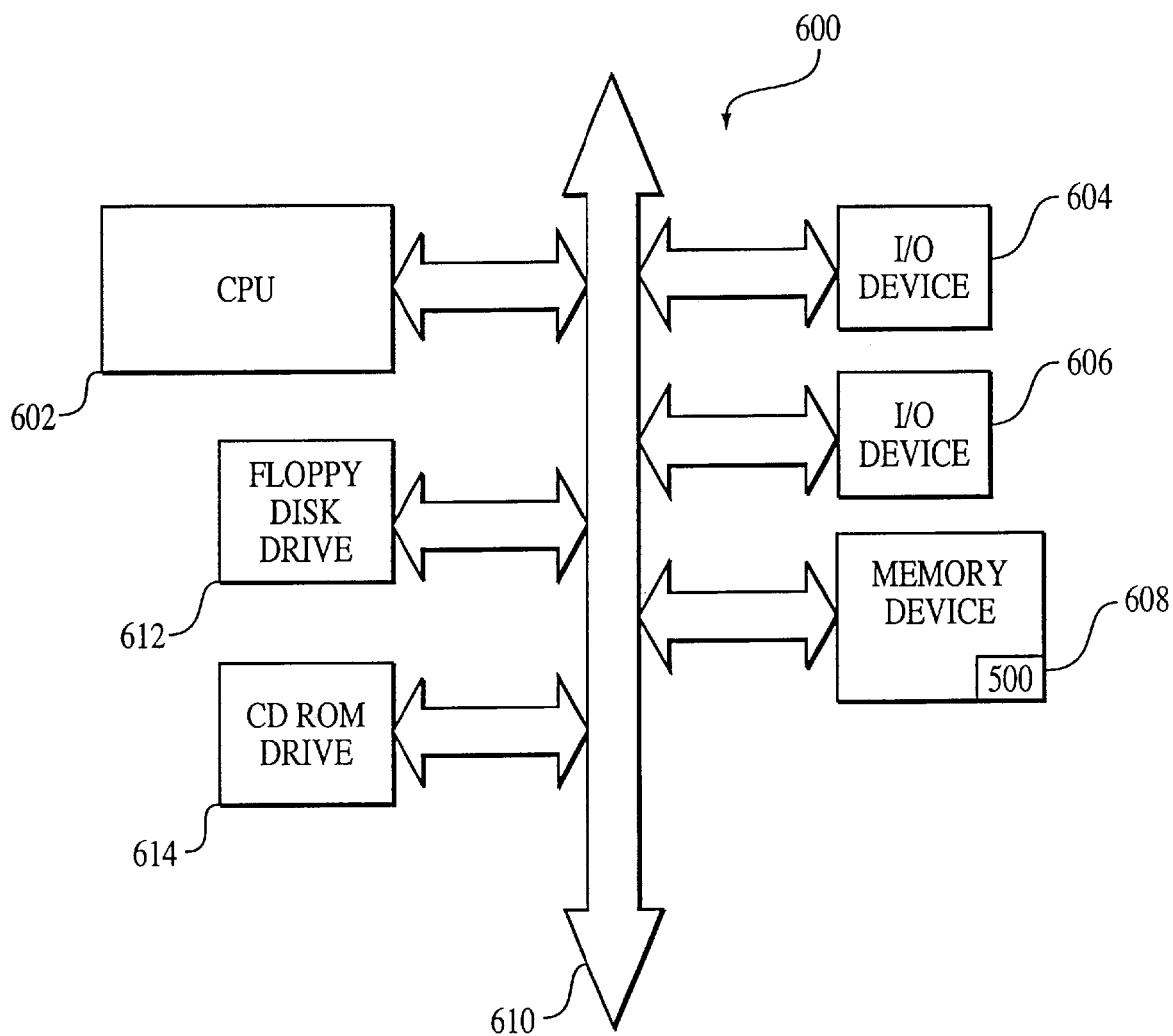
FIG. 4 illustrates a processor system employing a memory device containing the improved column latch device of FIG. 3.

FIG. 4. illustrates a simplified processor system 600 which may employ memory device(s) 608 containing the column latch device 500 and method of the present invention. Processor system 600 includes central processing unit (CPU) 602, memory device 608, input/output (I/O) device 604, floppy disk drive 612 and CD ROM drive 614. All of the above components communicate with each other over bus 618. The memory device 608 may use the FIG. 3 column latch device 500 for faster memory device access. Memory device 608 and CPU 602 may also be integrated together on a single chip.

It is to be understood that the above description is intended to be illustrative and not restrictive. Many variations to the above-described device and method will be readily apparent to those having ordinary skill in the art.

Accordingly, the present invention is not to be considered as limited by the specifics of the particular device and method which have been described and illustrated, but is only limited by the scope of the appended claims.

What is claimed as new and desired to be protected by Letters Patent of the United States is:

1. A processor system comprising:

a processor; and a memory device coupled to said processor, said memory device comprising:

a first latch having an input and an output, an input of said first latch being controlled by a compare signal from an address comparator;

a second latch having an input and an output, said output of said second latch selectively providing an enable signal to one of a row and column of a memory array; and a first switching device coupled to said output of said first latch and said input of said second latch; said switching device receiving a select signal and selectively applying said select signal to said second latch in response to the output of said first latch;

wherein said processor and said memory device are integrated on a single chip.

2. A memory device comprising:

a first latch having an input and an output and first and second states, an input of said first latch being controlled by a compare signal from an address comparator to cause said first latch to switch to said second state;

a second latch having an input and an output and first and second states, said output of said second latch, when in said second state, providing a signal enabler to one of a row and column of a memory array;

a switching device controlled by the output of said first latch, said switching device receiving a select signal and selectively applying said select signal to said second latch in response to the output of said first latch, said second latch switching to said second state in response to said select signal;

a first signal for initially setting said first latch to said first state;

a second signal for initially setting said second latch to said first state;

said compare signal switching said first latch from said first state to a second state when a select signal is present;

said select signal switching said second latch from said first state to said second state;

wherein said switching prevents said select signal from reaching said second latch when said first latch is in said second state; and wherein when the output of said first latch is in said second state said second latch remains in said first state.

* * * * *